US 6,723,474 B2

(12) United States Patent
Tomita et al.

(10) Patent No.: US 6,723,474 B2
(45) Date of Patent: Apr. 20, 2004

(54) METHOD OF FABRICATING DIFFRACTION GRATING AND DIFFRACTION GRATING

(75) Inventors: Junji Tomita, Kawasaki (JP); Fumio Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/795,442

(22) Filed: Mar. 1, 2001

(65) Prior Publication Data

US 2001/0008741 A1 Jul. 19, 2001

Related U.S. Application Data

(63) Continuation of application No. PCT/JP99/03736, filed on Jul. 9, 1999.

(30) Foreign Application Priority Data

Sep. 2, 1998 (JP) ............................................. 10-248646

(51) Int. Cl.$^7$ ................................................. G03F 9/00
(52) U.S. Cl. ..................... 430/5; 430/1; 430/2; 430/11; 430/321; 430/320; 216/24; 216/41
(58) Field of Search ........................... 430/1, 2, 5, 311, 430/320, 321, 946; 216/24, 41

(56) References Cited

U.S. PATENT DOCUMENTS 4,948,706 A * 8/1990 Sugihara et al. ............ 430/311
5,712,065 A * 1/1998 Chiang ............................ 430/7
5,786,116 A * 7/1998 Rolfson ............................ 430/5
6,306,562 B1 * 10/2001 Ikeda et al. .................. 430/320

FOREIGN PATENT DOCUMENTS

| JP | 60-33504 | 2/1985 |
| JP | 6-201909 | 7/1994 |
| JP | 8-334610 | 12/1996 |
| JP | 10-106047 | 4/1998 |

* cited by examiner

Primary Examiner—Janet Baxter
Assistant Examiner—Amanda C. Walke
(74) Attorney, Agent, or Firm—Westerman, Hattori, Daniels & Adrian, LLP

(57) ABSTRACT

A method of fabricating a diffraction grating by utilizing a single substrate comprises the steps of forming a photosensitive material layer and a light transmission reducing film having a predetermined pattern integrally with each other on the substrate, exposing the photosensitive material layer by exposure irradiation light via the light transmission reducing film, and developing the photosensitive material layer after exposure. It is composed so that the direction of exposure and the direction of development are opposite to each other. It is possible to fabricate a diffraction grating in which each grating is formed on a predetermined substrate at a predetermined pitch and a root portion in a cross-section of each diffraction grating is constricted. In this way, it is possible to reduce or eliminate interfaces, so that the generation of noise light can be effectively suppressed and a diffraction grating having a high diffraction efficiency can be made.

6 Claims, 7 Drawing Sheets

METHOD OF FABRICATING DIFFRACTION GRATING AND DIFFRACTION GRATING

CROSS-REFERENCE TO RELATED APPLICATIONS

This application is based upon and claims priority of Japanese Patent Application No. 10-248646, filed Sep. 2, 1998, the contents being incorporated therein by reference, and a continuation of PCT/JP99/03736 filed Jul. 9, 1999.

TECHNICAL FIELD OF THE INVENTION

The present invention relates to a method of fabricating a diffraction grating and a diffraction grating.

BACKGROUND OF THE INVENTION

Conventionally, a diffraction grating is fabricated in such a manner that, for example, as shown in FIG. 1, an optical mask 5 having a mask substrate 1 and a light shielding film 3 having a predetermined pattern formed on the mask substrate 1, and a resist substrate 11 having a substrate 7 and a resist layer (photosensitive material) 9 formed on the substrate 7, are prepared, respectively, the resist substrate 11 is put on the optical mask 5, and a luminous flux of exposure light (arrows) is vertically irradiated from the optical mask 5 side and after that, development is conducted on the same side as that of exposure.

However, since an air layer or a vacuum layer inevitably exist between the light shielding film 3 and the resist layer 9, noise light is generated by interfacial reflection during the exposure process, and a portion which must not be originally exposed to light is exposed to the noise light. Therefore, it is very difficult to fabricate, for example, a highly accurate diffraction grating, a diffraction grating of a fine profile and a diffraction grating the cross-section of which is oblique.

SUMMARY OF THE INVENTION

It is an object of the present invention to provide a method of fabricating a diffraction grating capable of effectively suppressing generation of noise light, by reducing or eliminating interfaces.

It is another object of the present invention to provide a diffraction grating having a new cross-sectional shape having a high diffraction efficiency.

In order to solve the above problems, a method of fabricating a diffraction grating by utilizing a single substrate, according to the present invention, comprises the steps of: forming a photosensitive material layer and a light transmission reducing film having a predetermined pattern integrally with each other on the substrate; exposing the photosensitive material layer by exposure to light via the light transmission reducing film; and developing the photosensitive material layer after exposure.

Preferably, the photosensitive material layer is provided on one side of the substrate and the light transmission reducing film is provided on the other side of the substrate. Preferably, the photosensitive material layer and the light transmission reducing film are provided on the same side of the substrate. Preferably, a reflection preventing layer is provided outside the photosensitive material layer. Preferably, a method of fabricating a diffraction grating further comprises the steps of: plating a surface of the photosensitive material layer after development; and fabricating a diffraction grating by utilizing the plated photosensitive material layer as a master grating. Preferably, a method of fabricating a diffraction grating further comprises the steps of: pouring resin onto a surface of the photosensitive material layer after development; curing the poured resin; and removing the cured resin.

A photosensitive substrate, according to the present invention, has a light shielding film having a predetermined pattern formed on one side thereof and a photosensitive material layer formed on the other side thereof.

A further photosensitive substrate, according to the present invention, has a light shielding film having a predetermined pattern formed on one side thereof and a photosensitive material layer formed on the light shielding film.

A diffraction grating is formed parallel to and on a predetermined substrate at a predetermined pitch, according to the present invention, wherein a root portion of each diffraction grating in cross-section is constricted.

Preferably, in cross-section of each diffraction grating, a portion from the root to the forward and is entirely oblique. Preferably, in cross-section of each diffraction grating, a forward end portion is formed into a profile in which rectangles are overlapped.

BRIEF DESCRIPTION OF THE DRAWINGS

The present invention will become more apparent from the following description of the preferred embodiment taken in connection with the accompanying drawings, in which.

BEST MODE FOR CARRYING OUT THE INVENTION

Referring to the accompanying drawings, a plurality of embodiments of the present invention will be explained below.

Figure 2A:
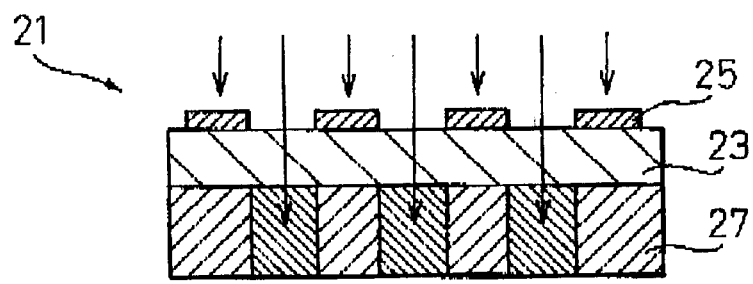
FIG. 2A is a view showing an exposure process relating to the first embodiment of the present invention.

FIG. 2A is a view showing an exposure process relating to the first embodiment of the present invention. In FIG. 2A, an optical mask 21 is composed in such a manner that a light shielding film (light transmission reducing film) 25 having a predetermined pattern is formed on one side (upper side in the drawing) of a single mask substrate 23 made of, for example, quartz glass which less absorbs ultraviolet rays. In this connection, the light shielding film 25 is a metallic film, which is made of metal such as chromium, chromium oxide, aluminum, titanium, nickel, silver and gold, capable of reducing transmission of a light, and the optical mask 21 is made in such a manner, for example, that a metallic film is vapor-deposited on the mask substrate 23, a resist layer is formed on the metallic film, electron beam (EB) drawing is conducted, and the metallic film is etched after development.

On the opposite side (lower surface in the drawing) of the mask substrate 23, a resist layer (photosensitive material layer) 27 is integrally formed. In this connection, the resist layer 27 can be composed of either the positive type resist material or the negative type resist material.

Figure 2B:
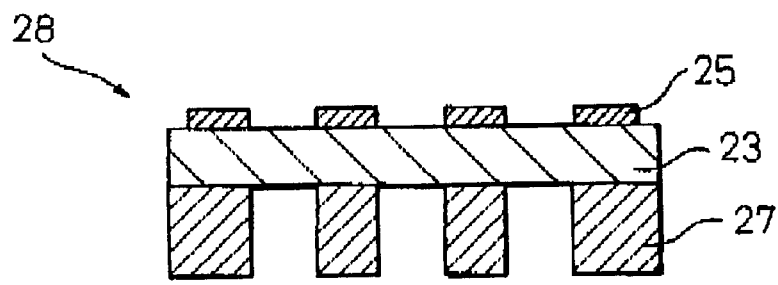
FIG. 2B is a view showing a development process of the optical mask of FIG. 2A.

A flux of exposure light (arrows) is irradiated from the side of the light shielding film 25 of the optical mask 21 to expose the resist layer 27. As shown in FIG. 2B, after the exposure, the optical mask 21 is developed, and a diffraction grating 28 is fabricated.

In this embodiment, in which the light shielding film 25 and the resist layer 27 are formed tightly and integrally with the mask substrate 23, an air layer or a vacuum layer are not interposed between the light shielding film 25 and the resist layer 27, compared with the conventional structure in which the resist substrate 11 (having the resist layer 9) and the mask substrate 1 (having the light shielding film 3) are arranged close to each other, and further the dimension between the light shielding film 25 and the resist layer 27 can be made uniform with high accuracy. Accordingly, it is possible to suppress the generation of noise light, the fabrication accuracy of the diffraction grating 28 can be enhanced, and the yield can be improved in the manufacturing process.

Figure 3:
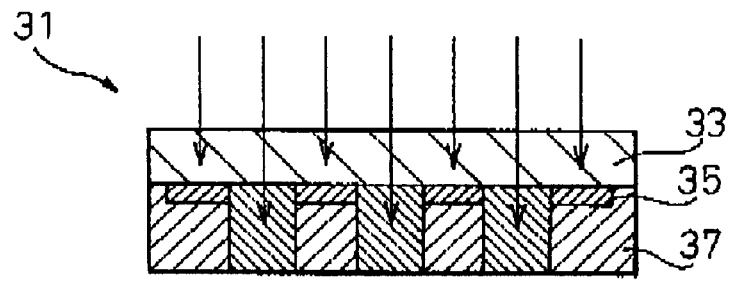
FIG. 3 is a view showing an exposure process relating to the second embodiment of the present invention.

FIG. 3 is a view showing an exposure process relating to the second embodiment of the present invention. In FIG. 3, the optical mask 31 is composed in such a manner that the resist layer 37 is integrally formed on the same side (lower surface) of the mask substrate 33 as the side on which the light shielding film 35 is formed and overlapped with the light shielding film 35. After exposure, development is conducted, and it is possible to fabricate a diffraction grating which is similar to the diffraction grating of FIG. 2B. In this embodiment having the arrangement in which the light shielding film 35 and the resist layer 37 are integrated with each other (without interposing the mask substrate between them), the light shielding film 35 and the resist layer 37 are directly attached to each other, so deterioration of resolution can be reduced, and a highly accurate diffraction grating can be fabricated.

Figure 1:
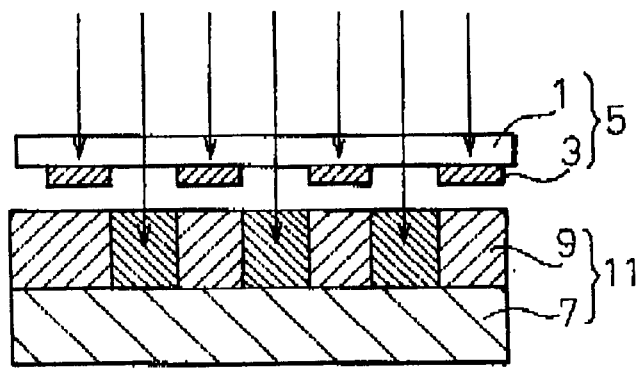
FIG. 1 is a view showing a method of fabricating a conventional diffraction grating.

Here, interfacial reflectance in the arrangement in which the mask substrate (or the resist substrate) 33 is used (FIG. 3) and interfacial reflectance in the conventional arrangement (the combination of the optical mask 5 and the resist substrate 11 in FIG. 1) are experimentally compared with each other, and the result thereof will be briefly explained below.

In the conventional arrangement, the interfacial reflectance between the mask substrate 1 and the air layer is 4.0%, and the interfacial reflectance between the resist layer 9 and the air layer is 5.3%, so the ray of exposure light is subjected to multiple reflection in the air layer and the resolution is extremely deteriorated, and after all, it is difficult to fabricate a highly accurate diffraction grating.

On the other hand, in the arrangement of this embodiment of FIG. 3, interfacial reflectance between the mask substrate 33 and the resist layer 37 is 0.1%, so it will be understood that the deterioration of resolution is remarkably suppressed, compared with the conventional arrangement.

Figure 4A:
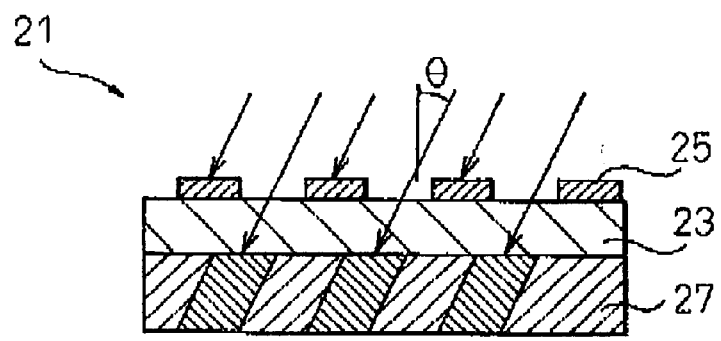
FIG. 4A is a view showing a process for obliquely exposing by using the optical mask of the first embodiment.
Figure 4B:
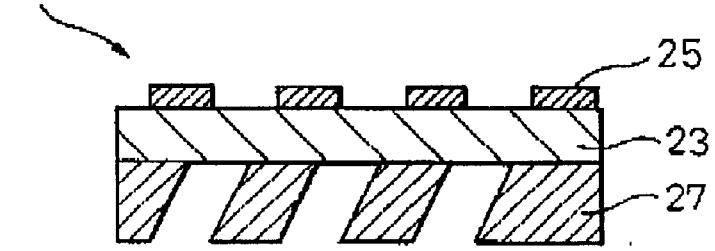
FIG. 4B is a view showing a development process for developing the optical mask of FIG. 4A.
Figure 5:
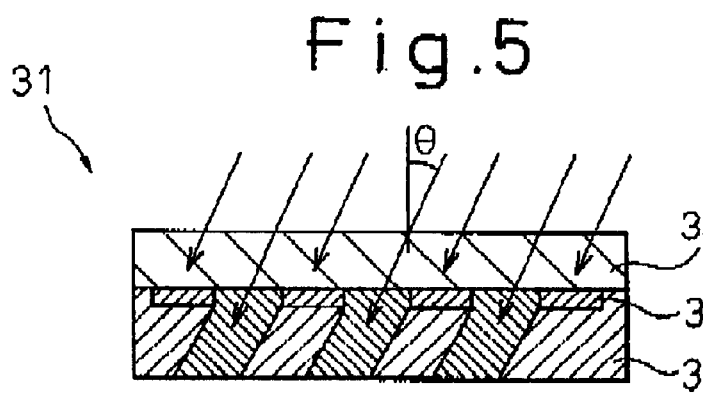
FIG. 5 is a view showing a process for obliquely exposing using the optical mask of the second embodiment.
Figure 6:
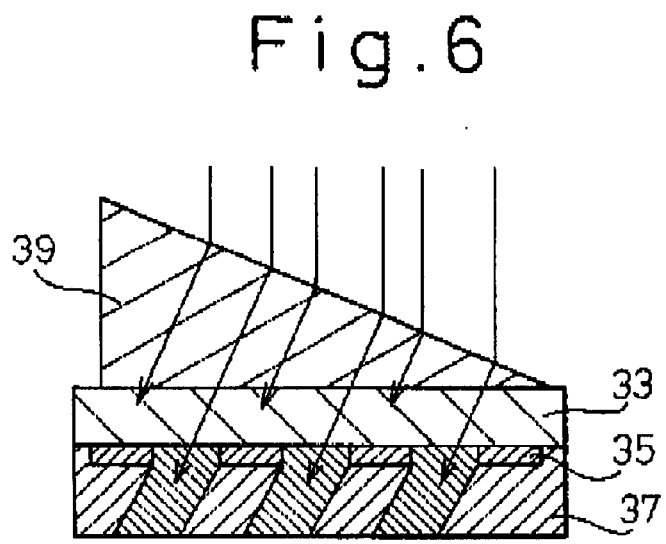
FIG. 6 is a view showing a process for obliquely exposing using a prism.

When the optical mask 21 or 31 relating to the first or second embodiment is used, it is possible to fabricate a diffraction grating having an oblique cross-sectional shape, by irradiating a flux of exposure light at a predetermined incident angle ($\theta$), as shown in FIGS. 4A and 5. For example, FIG. 4B shows a diffraction grating 29 which is obtained by developing the optical mask 21 after the exposure of it shown in FIG. 4A. When developing is conducted by using the optical mask 31 shown in FIG. 5, a similar diffraction grating to that described above can be obtained. The oblige irradiation can be carried out by an exposure device which is on the market but is specially remodeled, but it can be easily and conveniently carried out by arranging for example, a certain prism 39 on the mask substrate 33, as shown in FIG. 6.

Figure 7:
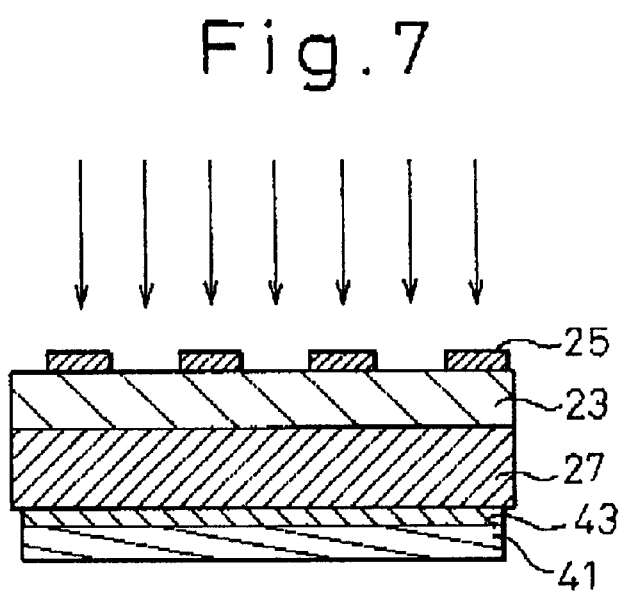
FIG. 7 is a view showing an arrangement in which a light absorption layer is provided.

In this connection, there is a possibility that a ray of light transmitting through the resist layer 27 or 37 in the exposure process is reflected by the surface of the resist layer so that noise light is generated which deteriorates the manufacturing accuracy of the diffraction grating. Means for avoiding the occurrence of the above problem is shown in FIG. 7 in which the countermeasure is applied to the optical mask 21 of FIG. 2. Referring to FIG. 7, there is provided a reflection preventing layer on the surface (lower surface) of the resist layer 27; as an example, there is provided a light absorbing layer 41 (comprising a photosensitive material or an oil-based material (for example, oil ink)). More practically, in order to make the light absorbing layer 41 easily removed and separated in the later process, there is provided a mixing prevention layer 43 (for example, made of aqueous polyvinyl alcohol) between the light absorbing layer 41 and the resist layer 27.

Figure 8:
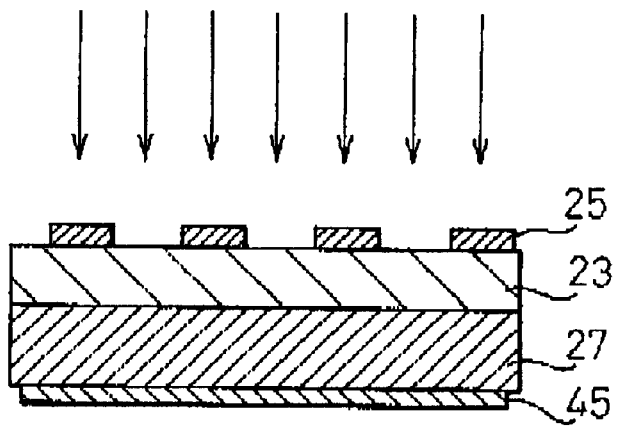
FIG. 8 is a view showing an arrangement in which a reflection preventing film is provided.

As another example of the reflection preventing layer, it is possible to form a light transmitting film capable of reducing reflection on the surface of the resist layer, that is, it is possible to form a reflection preventing film. An arrangement in which this is applied to, for example, the optical mask 21 of FIG. 2A is shown in FIG. 8. A reflection preventing film 45 is made of polyvinyl alcohol, for example, and the reflection preventing effect can be provided by controlling the film thickness so as to have a thickness of ¼λ of the wavelength of exposure light, for example.

The diffraction gratings 28 and 29 obtained by the above embodiments can be also used as an original of a diffraction grating. In this case, a metallic stamper is made in such a manner that an electrode film is formed on the surface of the diffraction grating by means of vapor-deposition or the like and then plating is conducted. By using this stamper or a stamper made by duplicating this stamper, it is possible to fabricate a large number of replicas of the diffraction grating at low cost.

As a specific method of duplicating the diffraction grating, for example, there are following methods: (1) An injection molding method in which thermally reversible resin is poured onto a surface (relief) of the stamper, and is cured, and then the resin is separated from the mold, to thereby fabricate a replica of the diffraction grating; and (2) 2P method in which ultraviolet ray curable resin is poured onto a surface of the stamper, a transfer substrate (glass) is put on it, ultraviolet ray is irradiated through the transfer substrate so as to cure the resin, and the resin is separated together with the transfer substrate from the mold to thereby fabricate a replica of the diffraction grating. In this connection, in this 2P method, it is possible to change the process in such a manner that ultraviolet ray curable resin is poured onto the transfer substrate and the diffraction grating original is put on this transfer substrate.

It is possible to directly fabricate a replica of a diffraction grating from the original of the diffraction grating, instead of fabricate (a replica of) a diffraction grating using the stamper. In this case, it is possible to fabricate (duplicate) a more highly accurate and faithful diffraction grating, and the method of duplicating a diffraction grating is fundamentally similar to that made by the stamper.

In the above 2P method, duplication is conducted by using the transfer substrate (glass), but instead of using the transfer substrate, in order to reduce the manufacturing cost, it is possible to directly transfer and duplicate a diffraction grating to a certain member in which the diffraction grating is formed. That is, a diffraction grating is formed as follows: Ultraviolet ray curable resin is directly poured onto a surface (relief) of the above original of the diffraction grating, a certain member is put on it, then ultraviolet rays are irradiated from the side of the original of the diffraction grating so as to cure the resin, and after that, the original of the diffraction grating is separated to thereby fabricate the diffraction grating. Due to the foregoing, it is possible to easily make a reflection type surface relief diffraction grating, for example, it is possible to directly make a diffraction grating on an aluminum vapor-deposited mirror. In this connection, it is possible to change the processes in such a manner that ultraviolet ray curable resin is poured onto a certain member and the original of the diffraction grating is put on it.

In this original of the diffraction grating, after the completion of the process of transfer, duplication and mold-separation, the diffraction grating made of resist is inevitably damaged, but the light shielding film and mask substrate are less damaged. Therefore, the resist layer (diffraction grating) of the original of the diffraction grating can be reused (recycled) as an optical mask (light shielding mask and mask substrate), by removing and cleaning the resist layer (diffraction grating) of the original of the diffraction grating and this is very reasonable and economical.

In this connection, it is well known that the deeper the grooves, the higher the diffraction efficiency of a diffraction grating. Therefore, in order to obtain a diffraction grating having deep grooves, it is considered to simply increase the thickness of a resist layer, but the thickness of the resist layer is limited due to the characteristics of a ray of exposure light. Accordingly, in general, it is difficult to fabricate a diffraction grating or a duplicated diffraction grating having desired deep grooves.

Figure 9:
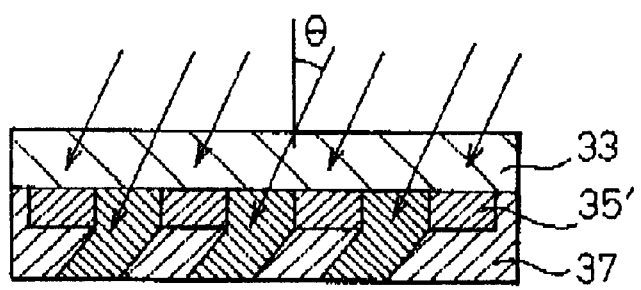
FIG. 9 is a view showing an exposure process using an optical mask having a thick light shielding film.
Figure 10:
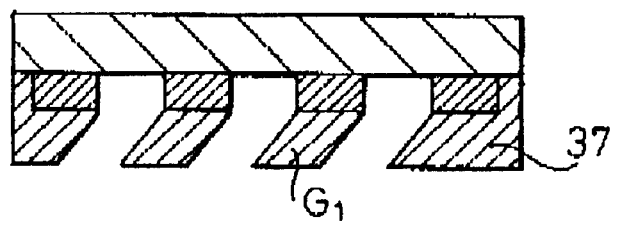
FIG. 10 is a view showing a state in which a diffraction grating having deep grooves is fabricated.
Figure 11:
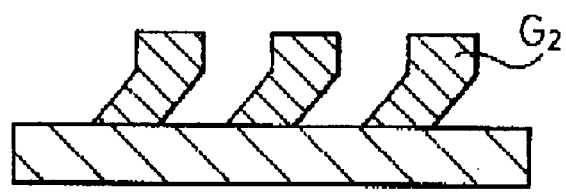
FIG. 11 is a view showing a replica of a diffraction grating.

However, by using a thick light shielding film 35' in the arrangement shown in FIG. 9, it is possible to fabricate a diffraction grating $G_1$ (made of the resist) having deep grooves as shown in FIG. 10. Further, by using this diffraction grating $G_1$ as an original, it is possible to fabricate (a replica of) a diffraction grating $G_2$ having deep grooves shown in FIG. 11.

After all, the light shielding film takes a part in the formation of the grooves, and it can be said that the sum of the thickness of the light shielding film and the depth of the resist grooves corresponds to the depth of the grooves of the diffraction grating. Accordingly, from the theoretical viewpoint, by setting and controlling the thickness of the light shielding film, it is possible to fabricate a diffraction grating or a replica of a diffraction grating, having very deep grooves, which could not be considered in the prior art.

Figure 12:
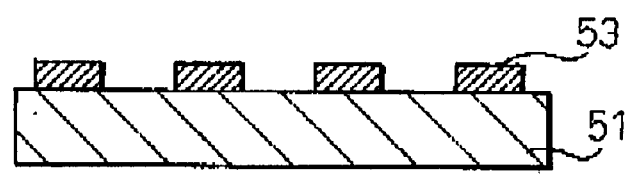
FIG. 12 is a view showing a substrate having a thick light shielding film.

An example of forming an optical mask having such a thick light shielding film will be explained below. For example, this is a method, as shown in FIG. 12, in which a metallic film (light shielding film) 53, the thickness of which is 1000 Å, is vapor-deposited on a quartz substrate 51, a resist layer is formed on this metallic film 53, electron beam (EB) drawing is then conducted, and the metallic film 53 is etched after etching. However, according to this forming method, when it is designed to form a thick metallic film, there is a possibility that the etching time is increased and the resist layer is damaged, and therefore, a method can be adopted in which the thickness of the metallic film to be vapor-deposited is appropriately adjusted and the metallic film (light shielding film) is made to grow by means of plating, to thereby form a thick light shielding film.

Figure 13:
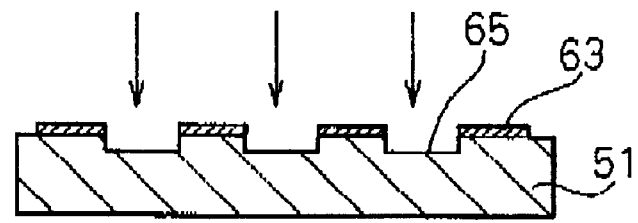
FIG. 13 is a view showing a substrate having deep grooves.

Instead of forming a thick light shielding film, it is possible to provide the same function as that of the thick light shielding film, by forming a light shielding film of an appropriate thickness and causing portions of the light shielding film to protrude (in other words, causing portions except for portions of the light shielding film to sink). That is, for example, as shown in FIG. 13, it is possible to form an optical mask (optical mask having step portions) having deep grooves 65, by vapor-depositing a metallic film (light shielding film) 63 on a quartz substrate 51, forming a resist pattern by exposure and development, forming a light shielding film having a predetermined pattern by dry etching method using reaction gas, and etching the quartz substrate 51, for example, by freon reaction gas. In this way, the optical mask can be formed. By using this optical mask, it is possible to fabricate a diffraction grating having deep grooves in the same manner as that of the optical mask having a thick light shielding film.

Finally, several examples of the profile of the diffraction grating capable of being formed according to the present invention will be explained below.

In the conventional process, the direction of exposure and that of development with respect to the resist layer are the same, but, in the process of this embodiment, the direction of exposure and that of development are opposite to each other. According to this characteristics and also according to the characteristics that the resist layer and the light shielding film are integrated with each other on one substrate, it is possible to fabricate not only a diffraction grating of a triangular shape, a saw-tooth shape, a rectangular shape, a sinusoidal shape or a half sinusoidal wave shape, but also for example, a diffraction grating having a new and remarkable cross-sectional shape, provided on a certain substrate 71, as shown in FIGS. 14 to 17. In these views, for example, the angles are set as follows:

$$\theta_1, \theta_2, \theta_3, \theta_4, \theta_6, \theta_8 < 90°$$

$$\theta_5, \theta_7 > 90°$$

Figure 14:
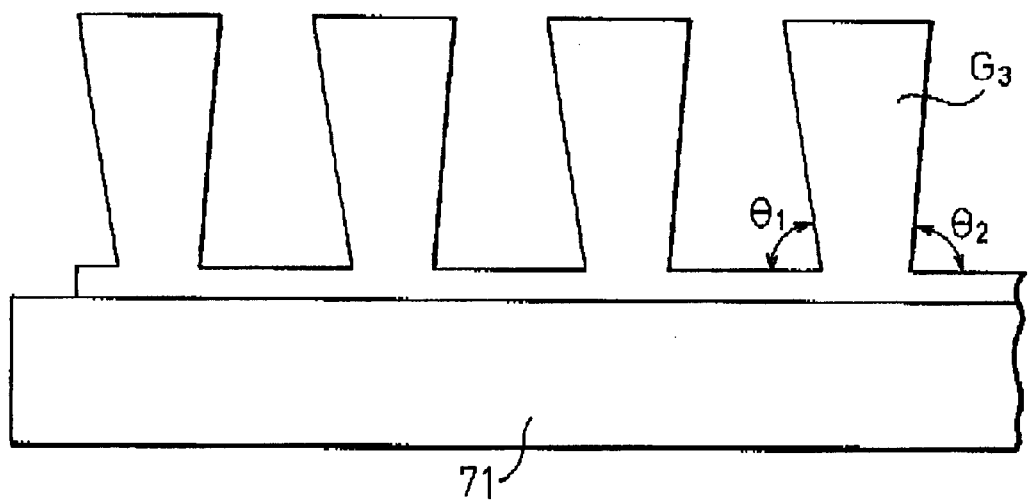
FIG. 14 is a view showing a diffraction grating having a new cross-sectional shape.
Figure 15:
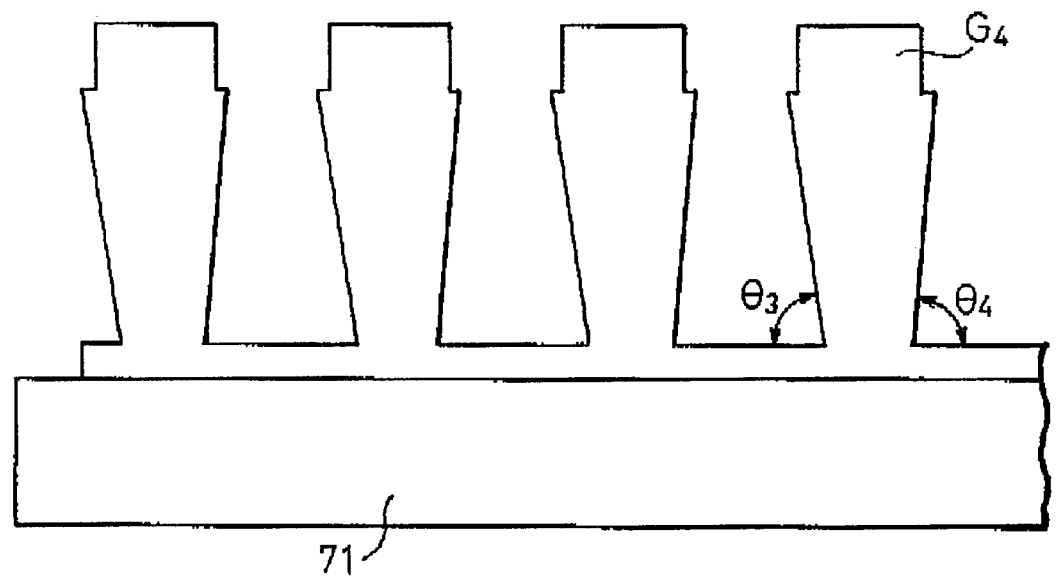
FIG. 15 is a view showing a diffraction grating having another new cross-sectional shape.
Figure 16:
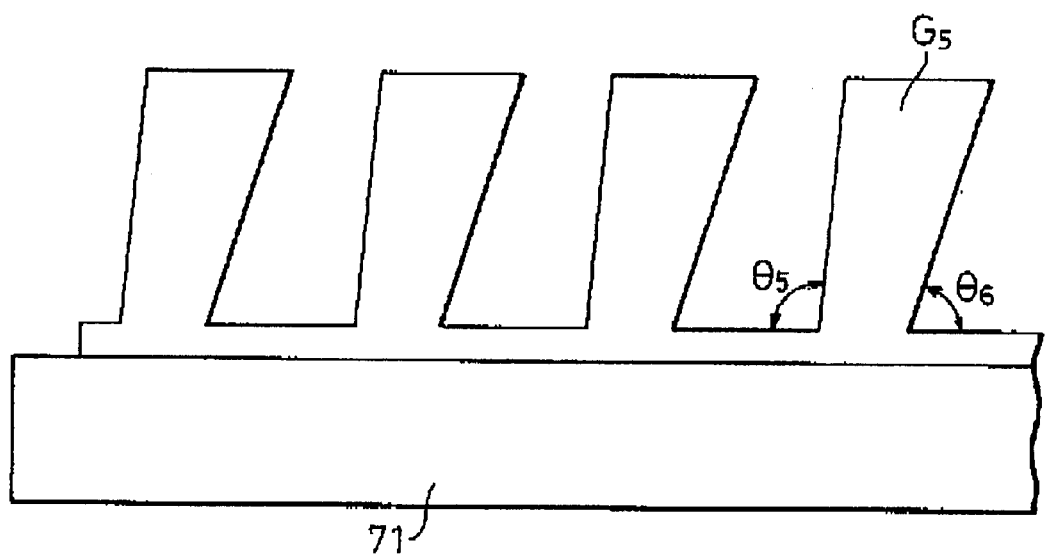
FIG. 16 is a view showing a diffraction grating having still another new cross-sectional shape.
Figure 17:
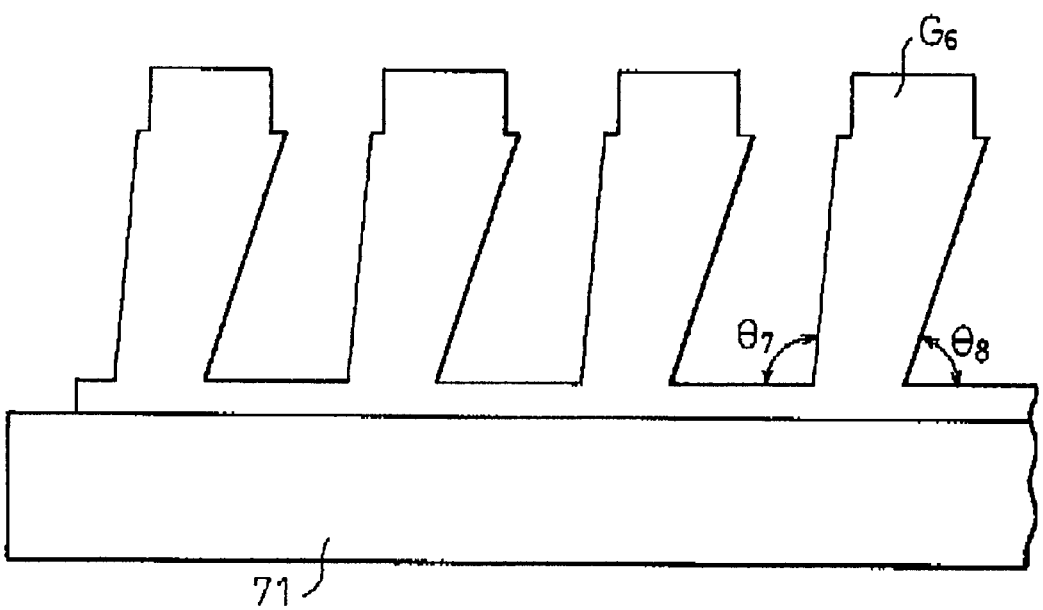
FIG. 17 is a view showing a diffraction grating having still another new cross-sectional shape.

Every diffraction grating is characterized in that the profile is formed into a reverse trapezoid and the root portion is constricted. Diffraction grating $G_4$ of FIG. 15 has a cross-sectional shape which is formed in such a manner that a rectangle is added to a diffraction grating $G_3$ of FIG. 14. Diffraction grating $G_5$ of FIG. 16 has a cross-sectional shape which is formed in such a manner that a diffraction grating $G_3$ of FIG. 14 is further inclined, and the diffraction grating $G_6$ of FIG. 17 has a cross-sectional shape which is formed in such a manner that a diffraction grating $G_4$ (except for the rectangular portion) of FIG. 15 is further inclined.

In the cases of these diffraction gratings $G_3$ to $G_6$ having the cross-sectional shapes in a reverse trapezoid, it is possible to provide a high diffraction efficiency, and it is difficult to duplicate the diffraction gratings, in other words, it is difficult to forge the diffraction gratings, and therefore, they are advantageous and very preferable.

As explained above, according to the present invention, it is possible to effectively suppress the generation of noise light by reducing or eliminating interfaces, and it is possible to fabricate a diffraction grating having a high diffraction efficiency.

What is claimed is:

1. A method of fabricating a diffraction grating by utilizing a single substrate, said method comprising the steps of:

forming a photosensitive material layer and a light transmission reducing film having a predetermined pattern integrally with the substrate, said predetermined pattern corresponding to a pattern of a diffraction grating to be fabricated;

exposing the photosensitive material layer by exposure irradiation light via the light transmission reducing film; and developing the photosensitive material layer after exposure, thereby forming the diffraction grating.

2. A method of fabricating a diffraction grating according to claim 1, wherein the photosensitive material layer is provided on one side of the substrate and the light transmission reducing film is provided on the other side of the substrate.

3. A method of fabricating a diffraction grating according to claim 1, wherein the photosensitive material layer and the light transmission reducing film are provided on the same side of the substrate.

4. A method of fabricating a diffraction grating according to claim 1, wherein a reflection preventing layer is provided outside the photosensitive material layer.

5. A method of fabricating a diffraction grating according to claim 1, further comprising the steps of:

plating a surface of the photosensitive material layer with metal to form a metallic stamper after development; and fabricating a diffraction grating by utilizing said stamper.

6. A method of fabricating a diffraction grating according to claim 1, further comprising the steps of:

pouring resin onto a surface of the photosensitive material layer after development;

curing the poured resin; and removing the cured resin.

* * * * *